United States Patent [19]
Verguld et al.

[11] Patent Number: 5,413,275
[45] Date of Patent: May 9, 1995

[54] METHOD OF POSITIONING AND SOLDERING OF SMD COMPONENTS

[75] Inventors: Martinus M. F. Verguld; Hubertus T. Mollen, both of Eindhoven, Netherlands

[73] Assignee: U.S. Philips Corporation, New York, N.Y.

[21] Appl. No.: 132,628

[22] Filed: Oct. 19, 1992

Related U.S. Application Data

[63] Continuation of Ser. No. 627,121, Dec. 13, 1990, abandoned.

[30] Foreign Application Priority Data

Dec. 20, 1989 [NL] Netherlands ............... 8903109

[51] Int. Cl.⁶ ............... B23K 1/005; B23K 31/02
[52] U.S. Cl. ............... 228/180.21; 228/232; 219/85.13
[58] Field of Search ............... 228/6.2, 103, 180.21, 228/230, 232, 234.1; 219/85.13, 85.15

[56] References Cited

U.S. PATENT DOCUMENTS

| 3,436,818 | 4/1969 | Merrin et al. | 228/180.2 |
| 3,617,682 | 11/1971 | Hall | 228/180.2 |
| 3,717,743 | 2/1973 | Costello | 219/85.13 |
| 3,912,153 | 10/1975 | Hartleroad et al. | 228/6.2 |
| 4,160,893 | 7/1979 | Meyen et al. | 228/6.2 |
| 4,312,692 | 1/1982 | Ikeda et al. | 156/272 |
| 4,657,169 | 4/1987 | Dostoomian et al. | 228/180.2 |
| 4,696,104 | 9/1987 | Vanzetti et al. | 228/103 |
| 4,735,354 | 4/1988 | Yagi et al. | 228/180 |
| 4,817,851 | 4/1989 | Kolesar et al. | 228/242 |
| 4,909,428 | 3/1990 | Mermet-Guyennet | 228/6.2 |

FOREIGN PATENT DOCUMENTS 0305697 7/1988 European Pat. Off. .

Primary Examiner—P. Austin Bradley
Assistant Examiner—Jeffrey T. Knapp
Attorney, Agent, or Firm—Ernestine C. Bartlett

[57] ABSTRACT

The invention relates to a method of positioning and soldering of electronic components on a printed circuit board. To this end, soldering material is first heated to a suitable molten temperature, after which the component is put in the liquid soldering material with its connections and the soldering material is then allowed to cool. Soldering is preferably carried out in an inert or slightly reducing atmosphere. Heating of the soldering material may take place in a single stage or in two stages.

24 Claims, 1 Drawing Sheet

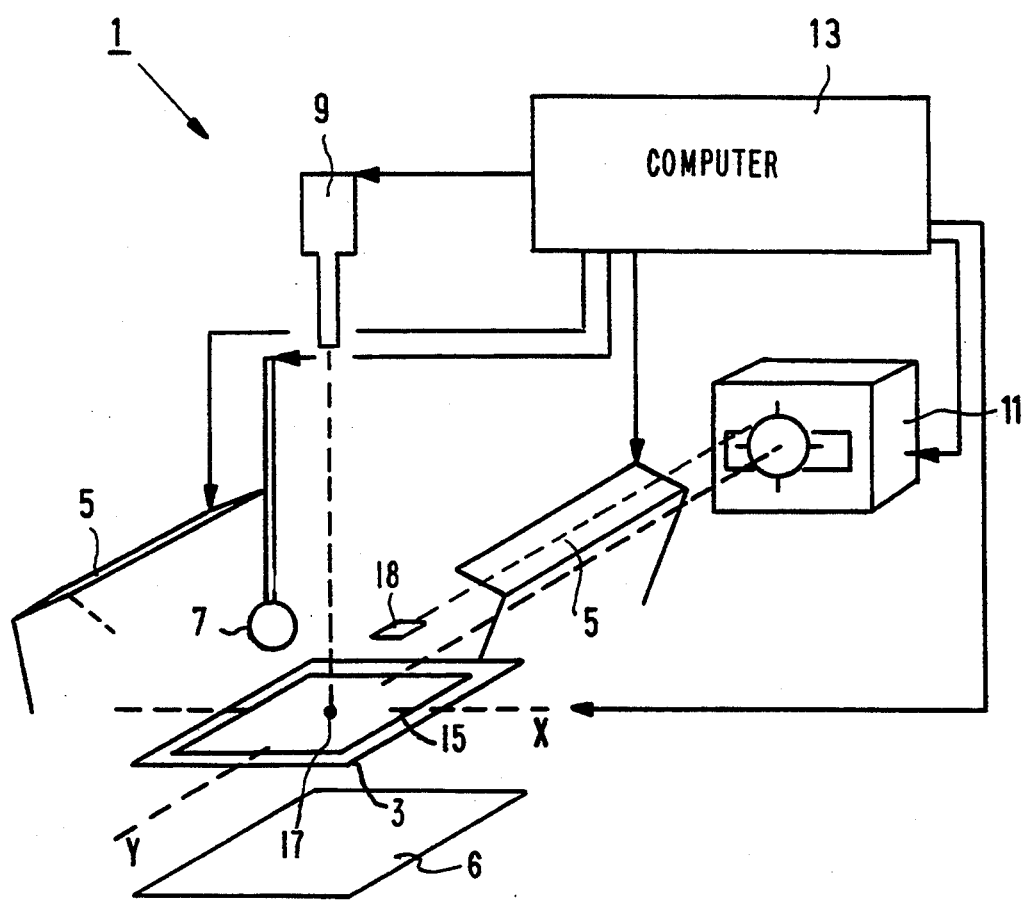

METHOD OF POSITIONING AND SOLDERING OF SMD COMPONENTS

This is a continuation of application Ser. No. 07/627,121, filed Dec. 13, 1990, now abandoned.

BACKGROUND OF THE INVENTION

The invention relates to a method of positioning and soldering of electronic components on a printed circuit board, in which method soldering material is locally applied on the printed circuit board and a positioned component is fastened to the printed circuit board by melting and subsequent cooling down of said soldering material.

Such a method is disclosed in U.S. Pat. No. 4,312,692. As described in this Patent, SMD components (Surface Mounted Devices) are put on the printed circuit board in contact with soldering paste, upon which the assembly is heated to a high temperature to soften or melt the soldering paste to a sufficient degree for obtaining a good adhesion between the components and the soldering material. The assembly is subsequently allowed to cool down again. As this Patent discloses, however, a disadvantage of this method is that components can easily become displaced during soldering, so that the positioning accuracy cannot be guaranteed, while also the formation of an even solder layer is difficult.

To solve these problems, the U.S. Pat. No. 4,312,692 proposes to fix the components first on the printed circuit board with an adhesive, which is cured by irradiation. The assembly thus obtained of printed circuit board and components glued to it may then be brought into contact with molten soldering material in order to achieve the soldered joint. A disadvantage of this method is that glueing of the components on the printed circuit board involves an additional process step, which considerably increases both the manufacturing cost and the time required for manufacture.

SUMMARY OF THE INVENTION

The invention has for its object to provide a method by whose application the disadvantages described above can be avoided.

According to the invention, the soldering material is first heated to a suitable melting temperature, then the component is positioned in the liquid solder with its connections, and finally the soldering material is cooled.

To carry out the method described above, soldering material is applied in the relevant spots of the printed circuit board. The soldering material may comprise a solder layer applied by thermal means, by electroplating, or by molten soldering paste. The printed circuit board provided with soldering material is heated to a temperature close to or above the melting temperature of the soldering material. Subsequently the components to be applied are pressed into the molten soldering material, which is provided on the printed circuit board in an adapted pattern, by means of suitable tools in accordance with the pattern in which they are to be provided on the printed circuit board, upon which the soldering material is allowed to cool.

The reproducibility of the soldering process can be well controlled in a preferred embodiment of the method according to the invention in that the heating of the soldering material takes place in two stages.

To heat the soldering material, the printed circuit board may be heated in its entirety, for example by means of infrared radiation or with a hot plate.

In the alternative the soldering material on the printed circuit board is heated locally. Infrared irradiation and hot air are very suitable heating means for this. The required thermal energy may be supplied in a very short period, in a concentrated form and accurately aimed by the use of laser irradiation for heating of the soldering material. Another alternative is the use of heated grippers for positioning the components, in particular ceramic components such as resistors and capacitors.

A combination of several of the above measures is employed in an additional alternative, for example, by heating the soldering material in two stages both by heating the entire printed circuit board and by local heating. Thus, for example, the printed circuit board may be heated from above by infrared irradiation up to a temperature well below the melting temperature of the soldering material. The soldering material is then locally heated further in the soldering spots to well above the melting temperature of the soldering material, upon which the components are positioned. The soldering material will harden when the heat sources used for the second heating step are removed, and the components will become fastened.

BRIEF DESCRIPTION OF THE DRAWING

The drawing shows the principle of an equipment, suitable for applying the method of the invention.

DESCRIPTION OF THE PREFERRED EMBODIMENTS

The equipment 1 comprises an x-y table 3, two infrared (IR) lamps 5 for region heating, a halogen lamp 7 used for local heating, an IR-thermometry system 9 for remote temperature sensing and a component placement system 11, all controlled by a computer 13. A printed circuit board PCB 15 is applied with solder in a known way and is fed to the x-y table 3. The IR-lamps 5 are switched on and the PCB 15 is heated to a temperature of about 150° C. The PCB 15 is moved by the x-y table 3 to a position whereby placement position 17 to be heated is under the halogen lamp 7. The halogen lamp 7 is switched on to locally heat position 17 when the thermometry system 9 measures the desired local temperature (+250° C.) at the position 17. At this time a relatively cool component 18, thus at ambient temperature, is placed by the component placement machine 11 in the liquid solder. The halogen lamp 7 is then switched off and the PCB 15 is moved by the x-y table 3 to a next position. The IR-lamp 5 is a 1000 Watt IR-radiator, fitted with a parabolic reflector to produce a good parallel beam. In the alternative, the PCB may be heated by a plate 6 or in conjunction with lamps 5. Output from the lamps 5,7 is controlled both by input voltage level and by a switch, controlled by the computer. The component placement can be done by an automated component placement system.

It will be clear that, when the method according to the invention is applied, components to be applied on a printed circuit board are simultaneously positioned correctly relative to the circuit board in one operation and soldered to the board. Compared with prior methods, the number of operations to which the printed circuit board and the components are subjected for achieving the soldered joints is considerably reduced. In addition, the use of glue becomes redundant.

It is also possible in the method according to the invention to position the components closer together than in the case of the known method since the components, once positioned, will not or only very slightly move relative to one another or relative to the substrate. This also has a favourable influence on the freedom of design of the circuit configuration.

Positioning and soldering of the components can take place while the printed circuit board is securely supported and a thinner printed circuit board can be used. For example, a printed circuit board of 0.8 mm thickness may be used as compared with prior board thicknesses of 1.6 mm. The thinner boards can be utilized, because the printed circuit board need not be subjected to further treatments, such as, for example, dipping in a solder bath or the like, after positioning and soldering. An additional saving in material as well as a lighter design of the printed circuit board is thus possible. Moreover, a better heat supply through the bottom of the printed circuit board takes place.

Care must be taken to avoid degradation, delamination or warping of the PCB due to excessive heating, especially by heating the entire PCB to the temperature at which the solder is molten. To heat the solder only locally by the halogen lamp has the disadvantage that the time to reach the right temperature is relatively long. Therefore, the best method is the combination of total heating of the PCB to a temperature below the temperature at which the solder is molten and local heating for heating the solder spots, where a component must be placed, to a temperature above the temperature at which the solder is molten. The local heating is performed by the halogen lamp 7 as mentioned above. Because solder oxidizes readily, fluxing determines whether or not wetting takes place. Fluxing before heating is the easiest method: the disadvantage is that the flux loses its activity during the process. This implies that the last solder surfaces and components will not be cleaned, and oxides present will prevent wetting. Fluxing at the instant of placing the component is similarly unfavorable. The surface is cleaned, but evaporation of flux compound removes a significant amount of heat, so wetting takes longer. Fluxing before local heating is preferred. No local heat is removed, the flux 13. 180 cleans while the surface is being heated and wetting proceeds rapidly. When the correct temperature and fluxing are chosen, soldering times of 1 second per component are achievable and proper joints are made. The time between wetting the printed circuit board (PCB) and the placement of the component on the board must be as short as possible to avoid causing the flux to lose its activity. The emissivity of the PCB and the solder spots where the component must be placed plays an important role in the measurement of a correct contactless temperature by system 9. For one embodiment the PCB has an emission factor of 0.9 whereas, the solder has an emission factor of 0.2. Soldering takes place preferably in an inert or slightly reducing atmosphere to prevent oxidation of the molten soldering material, of the components and of the connection surfaces of the printed circuit board.

We claim:

1. A method of surface mounting by positioning and soldering electronic components via their connection to the surface of a printed circuit board comprising:

locally applying soldering material to the surface of the printed circuit board;

preheating the printed board to a temperature below the melting point of said locally applied soldering material;

locally heating the locally applied soldering material to a temperature such that the soldering material is in the molten state;

placing a component and its connections in the molten soldering material; and substantially simultaneously cooling the soldering material to harden the solder and fasten the electronic component to the circuit board.

2. A method of surface mounting, by positioning and soldering, electronic components via their connections to the surface of a printed circuit board comprising:

applying soldering material to the printed circuit board;

melting the soldering material by heating the soldering material to a temperature such that the soldering material is in the molten state;

placing an electronic component and its connections in the resultant molten soldering material; and substantially simultaneously cooling the soldering material to thereby harden the soldering material and fasten said electric component to the printed circuit board.

3. A method of surface mounting, by positioning and soldering, electronic components via their connections to the surface of a printed circuit board comprising:

applying soldering material to the printed circuit board;

melting the soldering material by heating the soldering material to a temperature such that the soldering material is in the molten state;

placing an electronic component and its connections in the resultant molten soldering material; and cooling the soldering material to thereby harden the soldering material and fasten said electric component to the printed circuit board.

4. A method as claimed in claim 3 wherein heating of the soldering material takes place in two stages.

5. A method as claimed in claim 3 wherein the printed circuit board is heated in its entirety for heating the soldering material.

6. A method as claimed in claim 3 wherein the soldering material on the printed circuit board is heated locally.

7. A method as claimed in claim 3 wherein the soldering material is heated by infrared irradiation.

8. A method as claimed in claim 3 the soldering material is heated with hot air.

9. A method as claimed in claim 3 wherein the soldering material is heated by means of laser irradiation.

10. A method as claimed in claim 3 wherein the component is positioned by means of heated grippers.

11. The method of claim 3 further including applying flux to the soldering material.

12. The method of claim 3 wherein the melting step includes initially heating the board to a first temperature below which the soldering material melts and then locally heating portions of the soldering material to a temperature above which the soldering material melts.

13. The method of claim 12 including applying flux to the soldering material subsequent to heating the board and prior to said locally heating.

14. The method of claim 3 including sensing the temperature of the soldering material during said heating.

15. The method of claim 14 including sensing the temperature by sensing the radiation emitted by the heated solder.

16. The method of claim 15 including stopping the heating when the sensed temperature reaches a given value.

17. The method of claim 16 wherein the placing step includes placing the component in the molten solder prior to said stopping.

18. A method as claimed in claim 3 wherein the soldering takes place in an inert or slightly reducing atmosphere.

19. A method as claimed in claim 18, wherein the printed circuit board is heated in its entirety for heating the soldering material.

20. A method as claimed in claim 18, wherein the soldering material on the printed circuit board is heated locally.

21. A method as claimed in claim 18, wherein heating of the soldering material takes place in two stages.

22. A method as claimed in claim 21, wherein the printed circuit board is heated in its entirety for heating the soldering material.

23. A method as claimed in claim 21, wherein the soldering material on the printed circuit board is heated locally.

24. A method as claimed in claim 23, wherein the soldering material is heated by infrared irradiation.

* * * * *